(12) United States Patent
Chen

(10) Patent No.: US 6,346,456 B2
(45) Date of Patent: *Feb. 12, 2002

(54) METHOD OF IMPROVING ALIGNMENT FOR SEMICONDUCTOR FABRICATION

(75) Inventor: Chia-Chen Chen, Taipei (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/189,119

(22) Filed: Nov. 9, 1998

(51) Int. Cl.⁷ .............................................. H01L 23/544
(52) U.S. Cl. ........................ 438/401; 438/424; 438/700
(58) Field of Search ................................. 438/401, 424, 438/462, 700, 975, FOR 435, FOR 227

(56) References Cited

U.S. PATENT DOCUMENTS 5,786,260 A * 7/1998 Jang et al.
5,889,335 A * 3/1999 Kuroi et al.

* cited by examiner

Primary Examiner—George Fourson
Assistant Examiner—Joannie Adelle Garcia

(57) ABSTRACT

A method of improving alignment for semiconductor fabrication. A semiconductor substrate is provided. The semiconductor comprises a field region and a scribe line on which an alignment mark is comprised. A plurality of shallow trench isolation structures are formed on the field region and the alignment mark. Each of the shallow trench isolation structures is filled with an insulation layer. The insulation layer within shallow trench isolation trench on the alignment is partly or completely removed. A gate oxide layer and a poly-silicon layer are formed over the semiconductor substrate in sequence. The poly-silicon layer is defined to form a poly-line.

7 Claims, 5 Drawing Sheets

METHOD OF IMPROVING ALIGNMENT FOR SEMICONDUCTOR FABRICATION

BACKGROUND OF THE INVENTION

1. Field of the Invention

The invention relates to a method of improving the alignment during semiconductor fabrication process, and more particularly, to a method of improving the step height of an alignment mark after the formation of a shallow trench isolation (STI).

2. Description of the Related Art

Integration circuits (ICs) have reached every part of our daily lives. However, the process of fabricating an IC is very complex. Hundreds of steps are needed for making an IC. The fabrication normally takes one or two month to complete. The IC industry is a high technology industry including four main branches: IC design, wafer fabrication, wafer testing, and wafer packaging. Thus, IC industry is not only an advanced technology industry, but also a high risky industry which needs a tremendous capital to maintain.

For wafer fabrication, processes such as oxidation, diffusion, deposition, patterning, and etching, are further included. While exposing the photo-resist layer on the surface for patterning a wafer, in addition to a light source, a photo-mask for transferring the pattern is necessary.

For a normal process of a device, 10 to 18 steps of photolithography and etching are used. In every step of exposure, an alignment is necessary to obtain a precise pattern. Otherwise, a device failure is caused due to improper pattern transfer.

In a conventional exposure process, a photo-mask including an alignment mark is used. Corresponding to the photo-mask, alignment marks on the wafer for forming semiconductor devices are required. In the conventional alignment system, the step height of an alignment provides a scattering site or a diffraction edge. To perform an alignment process, a He—Ne laser with a wavelength of about 633 nm is normally used as the light source incident on the alignment mark. While the He—Ne laser is projected on the wafer, a diffraction effect is caused and reflected to an alignment sensor, for example, a dark field, a bright field, or a first diffraction interferometer alignment system. In case that the step height is small, for example, less than 200 Å, the diffraction effect is not obvious. Consequently, the alignment signal is too weak, or the noise ratio is too strong for the alignment sensor to detect.

In tradition ultra large semiconductor integration (ULSI), STI is a standard process flow for fabrication. The oxide chemical-mechanical polishing (CMP) in STI process usually planarize most of the topography to result in a small step height. With a step height of less than about 200 Å between the surface of an isolation region and the surface of a field region, the alignment mark on a scribe line results in a misalignment during alignment process.

In FIG. 1a to FIG. 1i, a conventional method of forming a shallow trench isolation is shown. As shown in FIG. 1a, a semiconductor substrate 100 is provided. A pad oxide layer (not shown) is form on the semiconductor substrate 100, and a silicon nitride having a thickness of about 1.5 kÅ is formed on the pad oxide layer.

In FIG. 1b, using a photo-mask, a photo-resist layer 104 is formed and defined on the semiconductor substrate 100. As a consequence, the silicon nitride layer 102 on an active region 101 of the semiconductor substrate 100 is covered by the photo-resist layer 104. On the contrary, the silicon nitride layer 102 on a predefined STI region of the semiconductor substrate 100 is exposed. The exposed silicon nitride layer 102 is removed by etching. The pad oxide layer is dipped and removed by using hydrogen fluoride solution as an etchant, so that the semiconductor substrate within the predefined STI region is exposed. As shown in FIG. 1c, part of the semiconductor substrate 100 within the isolation region is removed to form a trench with a depth of about 4 kÅ.

In FIG. 1d, the photo-resist layer 104 is removed. Over the semiconductor substrate 100, an insulation layer 106, for example, an oxide layer having a thickness of about 1000 Å, is formed and the trench is filled therewith. Under a temperature of about 1000° C., an annealing is performed for about 30 minutes.

In FIG. 1e, using CMP, the top surface of the semiconductor substrate 100 is polished and planarized with the silicon nitride layer 102 as a stop layer. The CMP process is performed until the silicon nitride layer 102 is exposed.

In FIG. 1f, the silicon nitride layer 102 is stripped by etching. The pad oxide layer is dipped and removed by using hydrogen fluoride solution (HF) as an etchant. Simultaneously, a part of the insulation layer 106 which fills the trench is removed by HF. The resultant STI is shown as FIG. 1g. A channel ion implantation 108 is performed on the active region 101 on the semiconductor 100.

In FIG. 1h, after the formation of a channel, a gate oxide layer 110 is formed over the semiconductor substrate 100. In FIG. 1I, a poly-silicon layer 112 is formed on the gate oxide layer 110. Using conventional photolithography, etching, and annealing processes, the poly-silicon layer 112 is defined into a poly-line.

As described above, while defining the poly-silicon layer 112 using photolithography, the alignment mark on the scribe line is used for alignment. However, using the conventional process of forming a STI, with the insulation layer filling within the trench on the alignment mark, a step height is not enough to obtain a proper alignment signal. A misalignment is easily caused.

SUMMARY OF THE INVENTION

It is therefore an object of the invention to provide a method of improving the alignment for semiconductor fabrication. After the formation of a shallow trench isolation, the insulation layer within the shallow trench isolation on the alignment mark in a scribe line is removed partly or completely in light of practical requirement. Therefore, the step height of the alignment is increased. As a result, the accuracy of alignment is enhanced, and the product yield is improved.

To achieve these objects and advantages, and in accordance with the purpose of the invention, as embodied and broadly described herein, the invention is directed towards a method of improving alignment for semiconductor fabrication. A semiconductor substrate is provided. The semiconductor comprises a field region and a scribe line on which an alignment mark is comprised. A plurality of shallow trench isolation structures are formed on the field region and the alignment mark. Each of the shallow trench isolation structures is filled with an insulation layer. The insulation layer within shallow trench isolation trench on the alignment is partly or completely removed. A gate oxide layer and a poly-silicon layer are formed over the semiconductor substrate in sequence. The poly-silicon layer is defined to form a poly-line.

It is to be understood that both the foregoing general description and the following detailed description are exemplary and explanatory only and are not restrictive of the invention, as claimed.

DESCRIPTION OF THE PREFERRED EMBODIMENTS

Figure 1A:
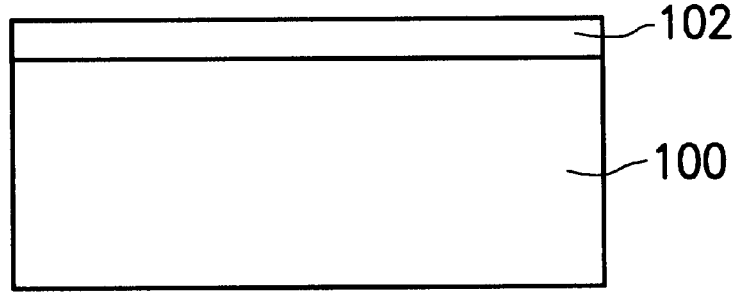
FIG. 1a to FIG. 1i show a conventional method of forming a STI.
Figure 1B:
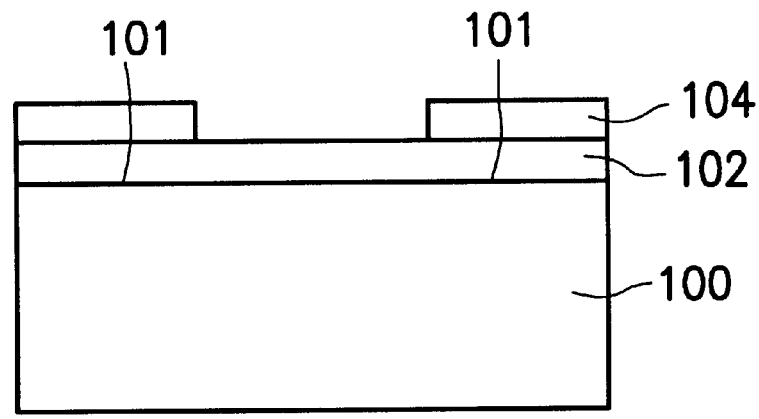
Figure 1C:
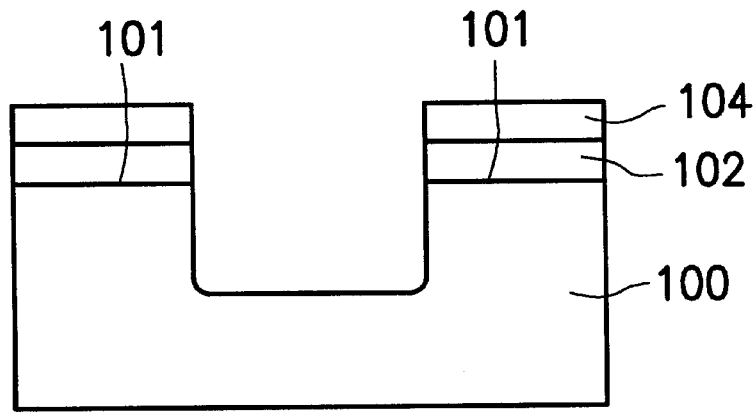
Figure 1D:
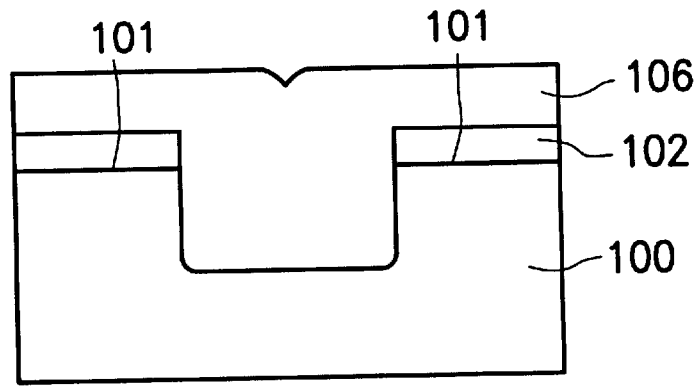
Figure 1E:
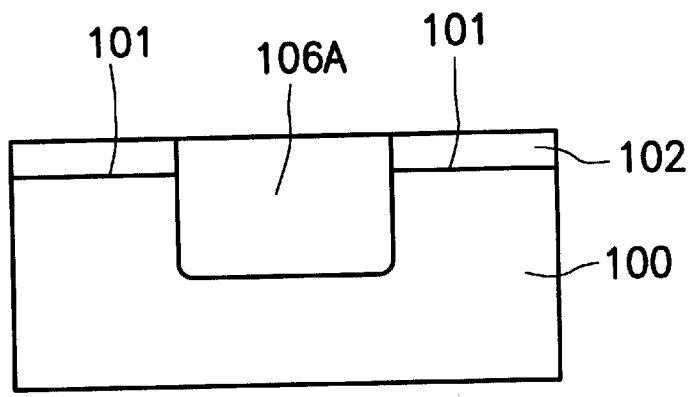
Figure 1F:
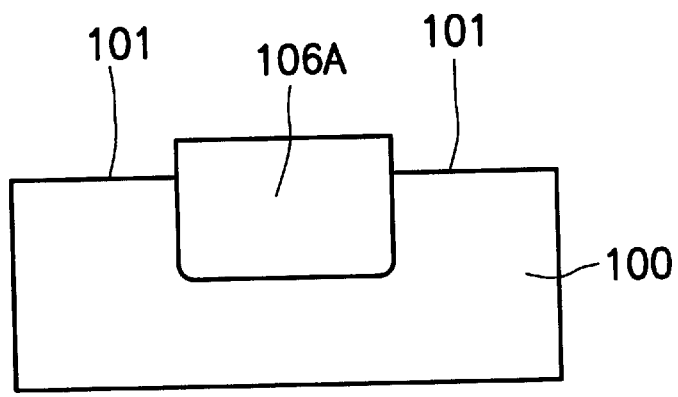
Figure 1G:
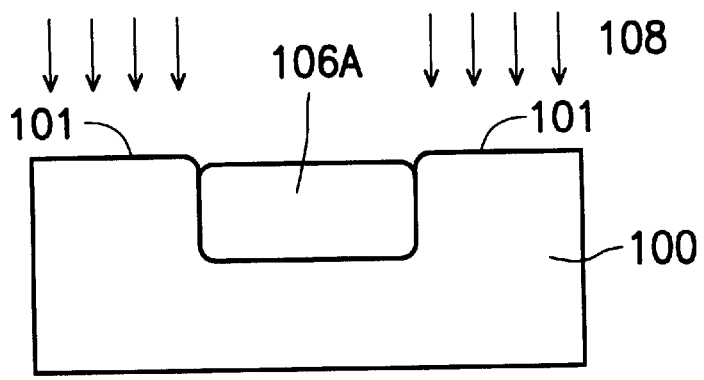
Figure 1H:
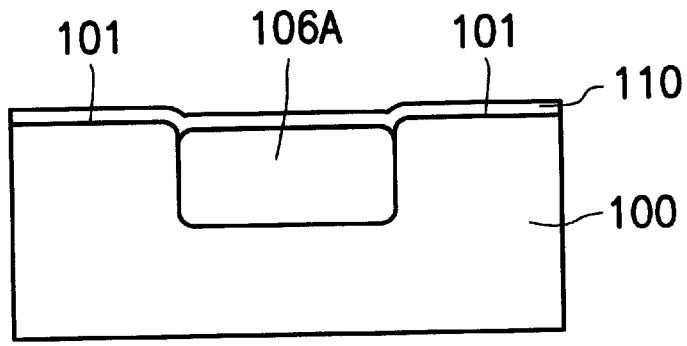
Figure 1I:
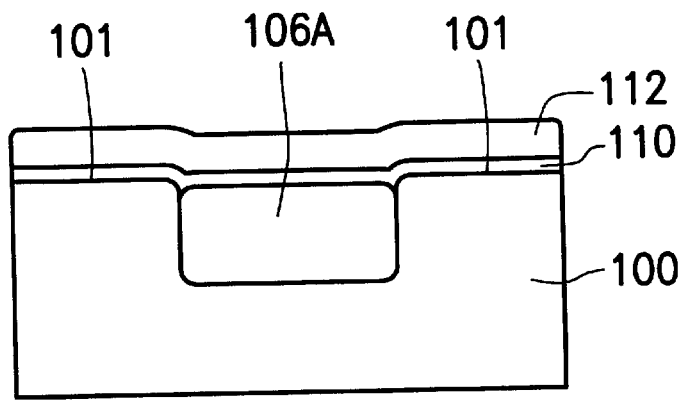
Figure 2A:
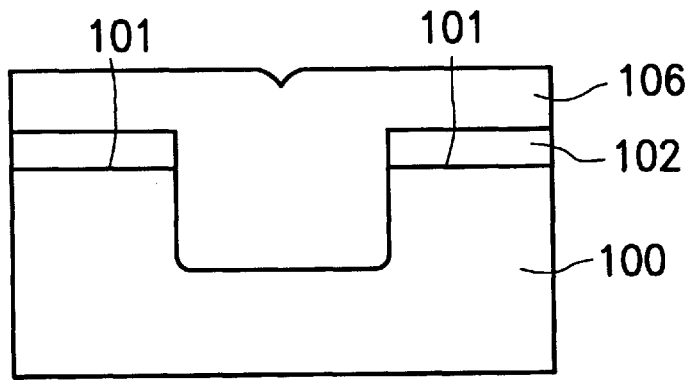
FIG. 2a to FIG. 2e show a method of forming a shallow trench isolation in a preferred embodiment according to the invention.

Referring to FIG. 2a to FIG. 2e, a method of forming a shallow isolation trench in a preferred embodiment according to the invention is shown. In FIG. 2a, using the above process explained in the prior art, a pad oxide layer (not shown) and a silicon nitride layer 102 having a thickness of about 1.5 kÅ are formed on a semiconductor substrate 100 sequentially. Using a photo-mask, a photo-resist layer (not shown) is formed and defined on the silicon nitride layer 102. As a consequence, an active region 101 and a pre-defined STI region are defined. The silicon nitride layer 102 on the predefined STI region is removed using etching. The pad oxide layer is dipped with HF and removed to expose the semiconductor substrate 100 therewithin. A part of the exposed semiconductor substrate 100 is then removed to form a trench with a depth of about 4 kÅ. An insulation layer 106, for example, an oxide layer, is formed over the semiconductor and fills the trench.

Figure 2B:
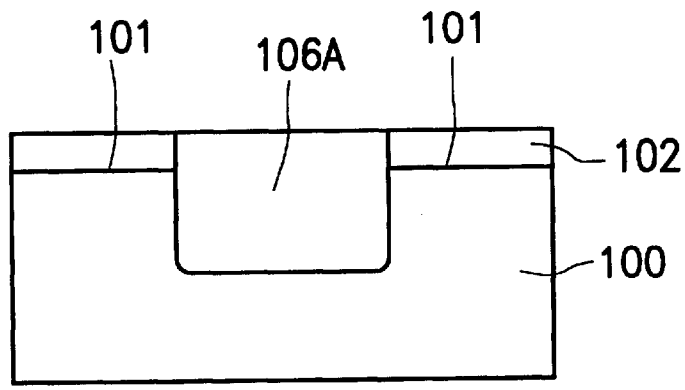

In FIG. 2b, CMP is performed with the silicon nitride layer 102 as a stop layer. That is, the polishing process is performed until the silicon nitride layer 102 is exposed.

Figure 2C:
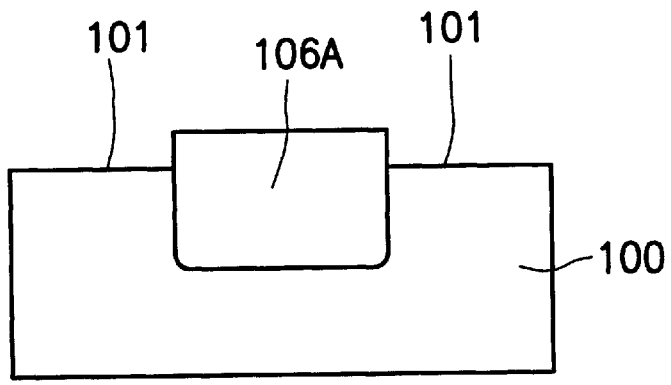
Figure 2D:
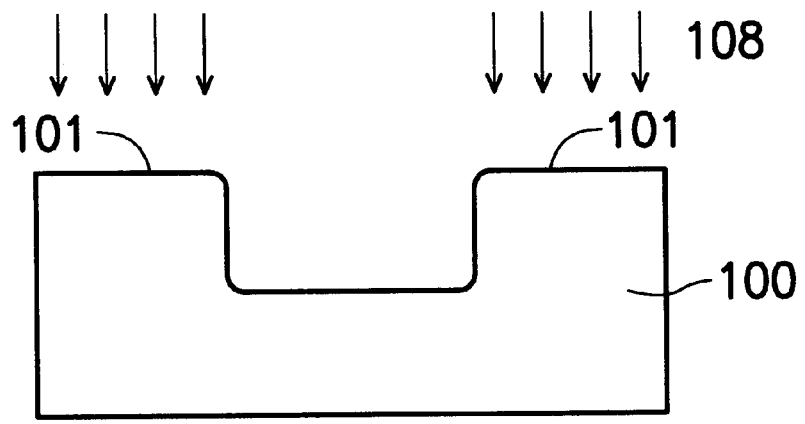

In FIG. 2c, the silicon nitride layer 102 is stripped. Using HF as an etchant, the pad oxide layer is dipped and removed. Meanwhile, a part of the insulation layer within the trench is removed simultaneously. For the shallow trench isolation on the alignment mark, to increase the step height thereof, the insulation layer is partly or completely removed. As a consequence, a structure shown as FIG. 2d is formed. An ion implantation 108 is performed on the active region to form a channel region.

Figure 2E:
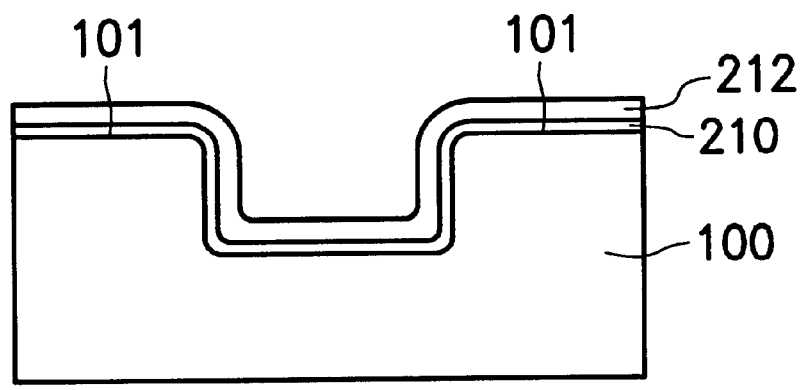

In FIG. 2e, a conformal gate oxide layer 210 and a conformal poly-silicon layer 212 are form over the semiconductor substrate 100. Using conventional photolithography and etching process, the poly-silicon layer is defined as a poly-line. As described above, in the invention, the alignment mark used to define a poly-line has an increased step height by clearing out the insulation layer within the STI on the alignment mark. Consequently, the alignment accuracy is improved, and the product yield is enhanced.

Other embodiment of the invention will appear to those skilled in the art formed consideration of the specification and practice of the invention disclosed herein. It is intended that the specification and examples to be considered as exemplary only, with a true scope and spirit of the invention being indicated by the following claims.

What is claimed is:

1. A method of improving alignment for semiconductor fabrication, comprising:

providing a semiconductor substrate, comprising a field region and a scribe line on which an alignment mark is comprised, wherein a pad oxide layer has been formed on the semiconductor substrate;

forming a plurality of shallow trench isolations in the field region and the alignment mark; and completely removing an insulation layer within the shallow trench isolation on the alignment mark while simultaneously removing the pad oxide layer on the semiconductor substrate.

2. The method according to claim 1, wherein the insulation layer includes an oxide layer.

3. The method according to claim 1, wherein after clearing out the insulation layer within the shallow trench isolation on the alignment mark, further comprises:

forming a poly-line over the substrate.

4. The method according to claim 3, the poly-line is formed by:

forming a gate oxide over the substrate;

forming a poly-silicon layer on the gate oxide;

defining the poly-silicon layer to form the poly-line.

5. A method of improving alignment for semiconductor fabrication, comprising:

providing a semiconductor substrate, comprising a field region and a scribe line on which an alignment mark is comprised, wherein a pad oxide layer has been formed on the semiconductor substrate;

forming a plurality of shallow trench isolations in the field region and the alignment mark;

completely removing an insulation layer within the shallow trench isolation on the alignment mark while simultaneously removing the pad oxide layer on the semiconductor substrate;

performing an ion implantation on the semiconductor substrate outside the shallow trench isolation; and forming a poly-silicon line over the semiconductor substrate.

6. The method according to claim 5, wherein the insulation layer includes an oxide layer.

7. The method according to claim 5, the poly-line is formed by:

forming a gate oxide over the substrate;

forming a poly-silicon layer on the gate oxide;

defining the poly-silicon layer to form a poly-line.

* * * * *